(12) United States Patent
Ren

(10) Patent No.: US 7,423,268 B2
(45) Date of Patent: Sep. 9, 2008

(54) PROJECTION IMAGING TYPE ELECTRON MICROSCOPE

(75) Inventor: Weiming Ren, Fujisawa (JP)

(73) Assignees: Nikon Corporation, Tokyo (JP); Ebara Corporation, Tokyo (JP)

( * ) Notice: Subject to any disclaimer, the term of this patent is extended or adjusted under 35 U.S.C. 154(b) by 334 days.

(21) Appl. No.: 11/177,140

(22) Filed: Jul. 8, 2005

(65) Prior Publication Data

US 2006/0011833 A1 Jan. 19, 2006

(30) Foreign Application Priority Data

Jul. 16, 2004 (JP) ............................. 2004-209429

(51) Int. Cl.
*G01N 21/00* (2006.01)
*G21K 7/00* (2006.01)

(52) U.S. Cl. ................... 250/311; 250/310; 250/396 R; 250/397; 250/492.3

(58) Field of Classification Search ......... 250/305–307, 250/309–311, 396 R, 396 ML, 397, 398, 250/492.1, 492.2, 492.3; 359/215
See application file for complete search history.

(56) References Cited

U.S. PATENT DOCUMENTS

| | | | | | |
|---|---|---|---|---|---|
| 4,434,367 | A | * | 2/1984 | Yonezawa | 250/311 |
| 6,184,526 | B1 | * | 2/2001 | Kohama et al. | 250/310 |
| 6,608,308 | B1 | * | 8/2003 | Takagi et al. | 250/311 |
| 6,661,008 | B2 | * | 12/2003 | Takagi et al. | 250/310 |
| 6,717,141 | B1 | * | 4/2004 | Rouse et al. | 250/306 |
| 6,717,145 | B1 | * | 4/2004 | Takagi et al. | 250/311 |
| 6,765,217 | B1 | * | 7/2004 | Nishimura et al. | 250/491.1 |
| 6,992,290 | B2 | * | 1/2006 | Watanabe et al. | 250/310 |
| 7,109,483 | B2 | * | 9/2006 | Nakasuji et al. | 250/310 |
| 7,135,676 | B2 | * | 11/2006 | Nakasuji et al. | 250/310 |
| 7,138,629 | B2 | * | 11/2006 | Noji et al. | 250/311 |
| 7,297,949 | B2 | * | 11/2007 | Nakasuji et al. | 250/307 |
| 7,351,969 | B2 | * | 4/2008 | Watanabe et al. | 250/310 |
| 2002/0130262 | A1 | * | 9/2002 | Nakasuji et al. | 250/311 |
| 2003/0030007 | A1 | * | 2/2003 | Karimata et al. | 250/396 R |
| 2005/0045821 | A1 | * | 3/2005 | Noji et al. | 250/311 |
| 2006/0011833 | A1 | * | 1/2006 | Ren | 250/310 |
| 2006/0169900 | A1 | * | 8/2006 | Noji et al. | 250/310 |
| 2007/0045536 | A1 | * | 3/2007 | Nakasuji et al. | 250/310 |

* cited by examiner

*Primary Examiner*—Bernard E Souw
(74) *Attorney, Agent, or Firm*—Frishauf, Holtz, Goodman & Chick, P.C.

(57) ABSTRACT

It is an object of the present invention to provide an projection imaging type electron microscope in which the imposition of restrictions on the design of the illumination electron optical system by the conditions of the projection electron optical system is alleviated, so that the degree of freedom in the design of the illumination electron optical system is increased. Generated electrons 6b (principal rays) emitted from the sample 5 parallel to the optical axis are focused by a cathode lens so that these electrons cross the optical axis 3 at one point. This point is the first crossover. The generated electrons 6b are oriented parallel to the optical axis by the cathode lens 4a, and are focused as an image at the position of the electromagnetic prism 2; these electrons pass through the stigmator 7, and are incident on the relay lens 8a. These electrons are again focused, and cross the optical axis 3 at one point. This position is the second crossover. An aperture diaphragm 11 is disposed in this second crossover position. As a result, the need to install an aperture diaphragm in the first crossover position is eliminated, so that design of the illumination electron optical system is facilitated.

10 Claims, 5 Drawing Sheets

PROJECTION IMAGING TYPE ELECTRON MICROSCOPE

BACKGROUND OF THE INVENTION

1. Field of the Invention

The present invention relates to an projection imaging type electron microscope which observes or inspects object surfaces by illuminating sample surfaces with an electron beam and using the secondary electrons, reflected electrons, or the like that are generated as a result.

2. Description of the Related Art

Mapping type electron microscopes are electron microscopes in which sample surfaces are observed in two dimensions by using an electron beam optical system to illuminate the sample surface with an electron beam, and using an electron beam optical system to focus an image of the secondary or reflected electrons generated as a result on the detection surface of a detector. Unlike an SEM, such an electron microscope makes it possible to reduce the number of times that scanning is performed; accordingly, the required sample observation time can be shortened, so that this type of microscope has attracted attention as an inspection device for micro-devices such as semiconductors.

An example of a microscope that is conceivable as such an projection imaging type electron microscope is shown in FIG. 5. An illuminating beam 34 emitted from a cathode 31 passes through a Wehnelt electrode 44, a first anode 45, a second anode 46 and an illumination electron optical system 32, and is incident on an electromagnetic prism 33. After the optical path of the illuminating beam 34 is altered by the electromagnetic prism (E×B) 33, the beam 34 passes through an objective electron optical system 37, and illuminates the surface of a sample 36.

When the illuminating beam 34 is incident on the sample 36, secondary electrons, backscattered electrons and reflected electrons with a distribution corresponding to the surface shape, distribution of materials, variation in potential and the like (referred to collectively as generated electrons 38) are generated from the sample 36. These generated electrons 38 pass through the objective electron optical system 37, electromagnetic prism 33 and image focusing electron optical system 39, and are projected onto an MCP (micro channel plate) detector 40; accordingly, an image is formed on the CCD camera 43 via an optical image projection optical system 42. Furthermore, 35 indicates a sample stage.

The optical path of the electron beam in the essential parts of such an projection imaging type microscope is shown in FIG. 6. In FIG. 6, the objective electron optical system 37 is shown as consisting of lenses 37a and 37b, and an aperture diaphragm 37c, and the image focusing electron optical system 39 is shown as consisting of lenses 39a, 39b, 39c and 39d.

After being caused to converge by the action of the lens 37a, the illuminating beam 34 diverges, and is caused to illuminate the sample 36 in a perpendicular (telecentric) manner by the action of the lens 37b. The position where the illuminating beam converges is the first crossover position in the projection image focusing optical system. The generated electrons 38 that are generated from a point on the optical axis of the sample 36 converge at the position of the electromagnetic prism 33 after leaving the objective electron optical system 37; subsequently, these electrons are acted upon by the lenses 39a, 39b, 39c and 39d, and are focused as an image on the MCP detector.

The generated electrons 38b (principal rays) that are emitted in a direction parallel to the optical axis from points that are off the optical axis of the sample 36 pass through the first crossover position, and are acted upon by the lenses 39a, 39b, 39c and 39d so that these electrons cross the optical axis twice as shown in the figures. The position where these electrons initially cross the optical axis following the first crossover position is called the second crossover position. Since the aperture diaphragm 37c is disposed in the first crossover position, the generated electrons 38 constitute the principal rays, and the opening angle of the projection electron optical system including the objective electron optical system and image focusing electron optical system is determined by the aperture diaphragm 37c.

Furthermore, the illuminating beam 34 is arranged so that this beam illuminates the sample 36 by Koehler illumination. Specifically, the system is arranged so that the aperture diaphragm (not shown in the figures) disposed in the illumination electron optical system 32 in FIG. 5 is in a conjugate relationship with the first crossover position. The aperture diaphragm 37c is disposed in order to determine the opening angle of the projection electron optical system, and may be omitted as far as the inherent illumination electron optical system is concerned.

Furthermore, the lenses 39a and 39b act as zoom lenses, and the image focusing magnification can be varied by altering the applied voltage so that the power balance of the lenses 39a and 39b is altered. Moreover, the lenses 39c and 39d act as projection lenses.

SUMMARY OF THE INVENTION

[Problems to Be Solved by the Invention]

However, the following problems have been encountered in optical systems of the type shown in FIG. 6. Specifically, in cases where the opening of the aperture diaphragm 37c disposed at the first crossover is small, there is a possibility that the illuminating beam from the illumination electron optical system will be knocked out by this aperture diaphragm. Accordingly, the illumination electron optical system must be designed while taking the conditions of the projection electron optical system into account; this is one factor that limits the degree of freedom in the design of the illumination electron optical system.

The present invention was devised in light of such circumstances; it is an object of the present invention to provide an projection imaging type electron microscope which alleviates the restrictions imposed on the design of the illumination electron optical system by the conditions of the projection image focusing electron optical system, and which increases the degree of freedom in the design of the illumination electron optical system.

[Means Used to Solve the Problems]

The first means used to solve the problems described above is a projection imaging type electron microscope in which a sample surface is observed by causing an illuminating electron beam emitted from an electron beam source to be incident on an electromagnetic prism via an illumination electron optical system. The sample surface is illuminated via an objective electron optical system with the illuminating electron beam that passes through the electromagnetic prism, and electrons generated from the sample surface are conducted to the electromagnetic prism via the objective electron optical system. The electrons that pass through the electromagnetic prism are conducted to a detector via an image focusing electron optical system, and an image of the sample surface is focused on the detection surface of the detector. The system is devised so that the sample surface is illuminated with the illuminating electron beam by Koehler illumination, and such that the objective electron optical system is formed as an object-side telecentric optical system. Moreover, an aperture diaphragm is provided the projection image focusing electron optical system (including the objective electron optical system, electromagnetic prism and image focusing optical system) that focuses an image of the sample surface on the image focusing surface of the detector. The aperture diaphragm is disposed at the position of the second electron beam crossover (second crossover) (as counted from the object surface constituting the sample surface) in the projection image focusing optical system.

In this means, the aperture diaphragm of the projection image focusing optical system is disposed at the second crossover position. Accordingly, since there is no need to dispose an aperture diaphragm in the first electron beam crossover (first crossover) position, the imposition of a design restriction on the illumination electron optical system by the aperture diaphragm is eliminated.

The second means used to solve the problems described above is the first means, wherein a diaphragm with a size that does not block the effective range of the illuminating electron beam, and that does not block the electron beam passing through the aperture diaphragm of the projection image focusing optical system, is disposed at the first electron beam crossover (first crossover) position (as counted from the object surface) in the projection image focusing optical system.

In the first means, in cases where the aperture diaphragm conventionally disposed at the first crossover position is completely removed, large quantities of generated electrons reach the optical system on the rear side of the first crossover position, and these electrons may collide with the optical elements such as lenses, so that these optical elements are contaminated; furthermore, the image focusing characteristics may deteriorate as a result of the Coulomb effect produced by these generated electrons. Accordingly, in this second means, a diaphragm with a size that does not block the effective range of the illuminating electron beam, and that does not block the electron beam passing through the aperture diaphragm of the projection image focusing optical system, is disposed in the first crossover position. Since this diaphragm has the size described above, this diaphragm does not affect the illuminating electron beam, and does not cause any knocking out of the electron beam that is considered to be necessary for the projection image focusing optical system. Furthermore, subsequent contamination of the optical elements or an increase in the Coulomb effect can be prevented by cutting the excess electron beam at the first crossover position.

The third means used to solve the problems described above is the first means or second means, wherein a stigmator that corrects the astigmatic aberration of the electromagnetic prism is disposed between the electromagnetic prism and the aperture diaphragm.

Since the electromagnetic prism causes the light beam passing through to converge in the electric field direction, the convergence position of the electron beam differs in the electric field direction and magnetic field direction of the electromagnetic prism. Since there is only one position in which an aperture diaphragm is disposed, electrons that are emitted from the sample parallel to the optical axis may not pass through the center of the aperture diaphragm depending on the electric field direction and magnetic field direction of the electromagnetic prism. Accordingly, telecentric image focusing of points outside the optical axis on the side of the sample becomes impossible, so that the aberration is aggravated.

In the present means, the positional separation of the second crossover generated mainly by the electromagnetic prism (i.e., the fact that the second crossover position differs in the electric field direction and magnetic field direction of the electromagnetic prism) is corrected by means of a stigmator, so that the aperture diaphragm is disposed in the second crossover position in this case. Accordingly, all of the electrons emitted from the sample parallel to the optical axis pass through the center of the aperture diaphragms, so that the problem described above is solved.

The fourth means used to solve the problems described above is any of the first through third means, wherein the projection image focusing electron optical system has a zoom lens, and has a relay optical system between the zoom lens and the electromagnetic prism, and the second crossover is disposed in the relay optical system.

In a conventional projection imaging type electron microscope, as is shown in FIG. 6, the second crossover position is formed inside the zoom lens system. However, because of the nature of a zoom lens, this crossover position moves when the magnification is varied; accordingly, in such an optical system, it is difficult to ensure that the aperture diaphragm is disposed in the second crossover position.

Accordingly, in the present means, a relay optical system is installed between the zoom lens and the electromagnetic prism, and the second crossover is formed inside this relay optical system, so that the aperture diaphragm is disposed in this position.

The fifth means used to solve the problems described above is the fourth means, wherein the relay optical system is a system which focuses a first intermediate image of the sample surface as a second intermediate image by means of a first lens, and in which a second lens is disposed in the position of the second intermediate image.

As will be described later in the embodiment of the present invention, by forming the relay optical system with such a construction, it is possible to increase the distance between the first intermediate image plane and the first lens compared to relay optical systems that have been widely used in the past, so that a stigmator can easily be installed in this position. Or conversely speaking, in cases where a stigmator is installed, the length of the relay optical system can be shortened compared to the length of relay optical systems used in the past, so that the overall length of the projection imaging type electron microscope can be reduced, and the Coulomb effect can be reduced. Furthermore, by performing adjustments in combination with the zoom optical system, it is possible to improve the telecentric properties at the third intermediate image focusing plane.

Furthermore, in the present means, the first intermediate image plane, first lens, and the like are referred to using ordinal numerals. However, this is done in order to distinguish these parts from other parts, and does not mean (for example) that the first intermediate image is the initial intermediate image in the optical system, or that the first lens is the initial lens in the optical system.

The sixth means used to solve the problems described above is any of the first through fifth means, wherein the zoom lens consists of two lenses, and these two lenses are constructed with plane symmetry in which a plane oriented at right angles with respect to the optical axis is the plane of symmetry.

In this means, the two lenses that constitute the zoom optical system are constructed so that these lenses show plane symmetry with a plane oriented at right angles with respect to the optical axis taken as the plane of symmetry; accordingly, these lenses act in such a direction that the aberrations cancel each other, thus preventing an aggravation of the aberration.

[Effect of the Invention]

The present invention alleviates the restrictions imposed on the design of the illumination electron optical system by the conditions of the projection electron optical system, thus making it possible to provide an projection imaging type electron microscope in which the degree of freedom in the design of the illumination electron optical system is increased.

EXPLANATION OF SYMBOLS

1: Illuminating beam; 2: Electromagnetic prism; 3: Optical axis; 4a: Cathode lens; 4b: Cathode lens; 5: Sample; 6a: Generated electrons; 6b: Generated electrons; 7: Stigmator; 8a Relay lens; 8b: Relay lens; 9a: Zoom lens; 9b: Zoom lens; 10a: Projection lens; 10b: Projection lens; 11: Aperture diaphragm; 12: Auxiliary diaphragm; 21: Intermediate image plane; 22: Intermediate image plane; 23: Relay lens; 24: Relay lens; 25: Zoom lens; 26: Zoom lens; 27: Intermediate image plane; 28: GND electrode; 29: Application electrode; 30: GND electrode.

BEST MODE FOR CARRYING OUT THE INVENTION

Figure 5:
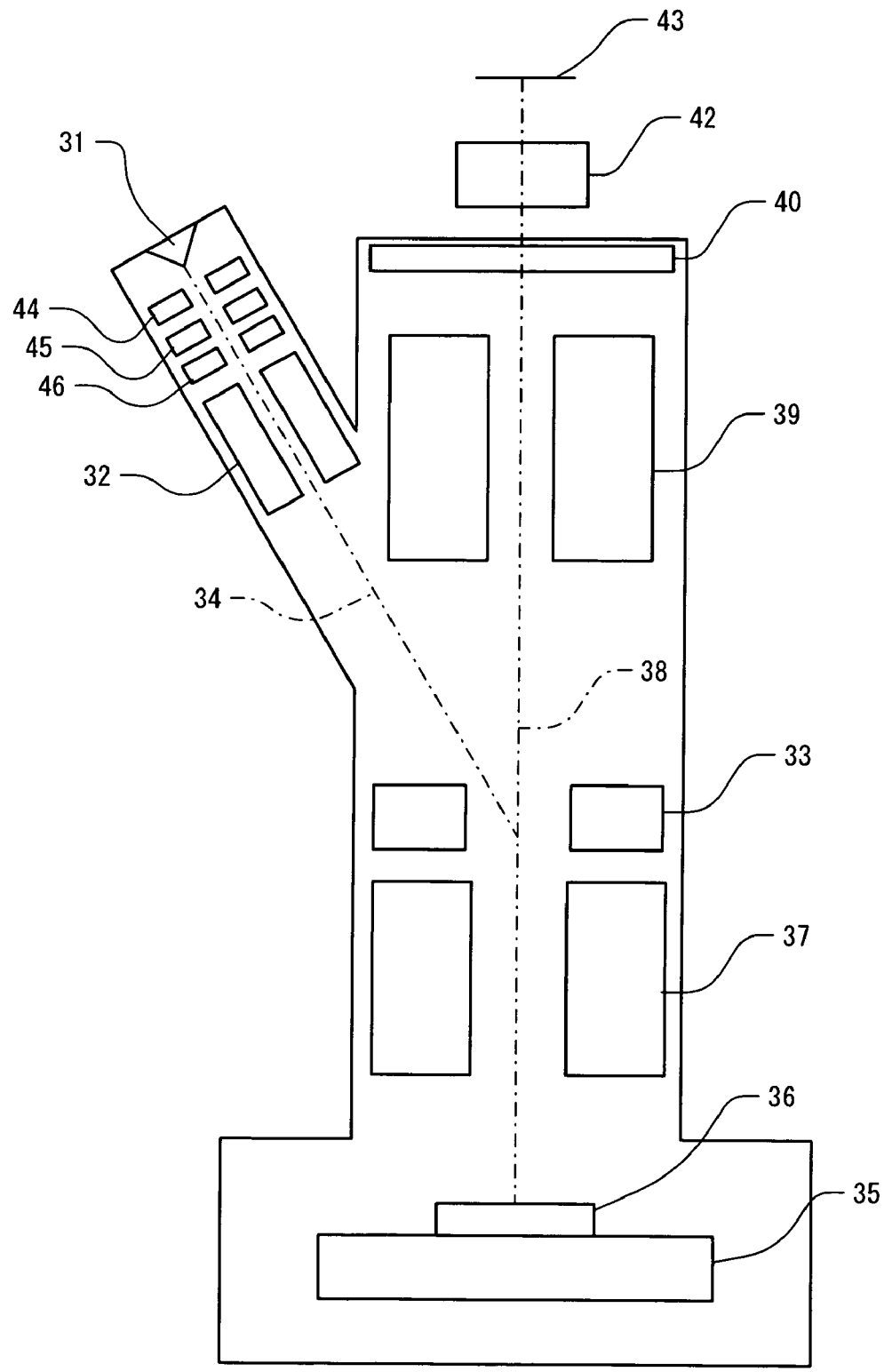
FIG. 5 shows an outline of a system conceivable as an projection imaging type electron microscope.
Figure 6:
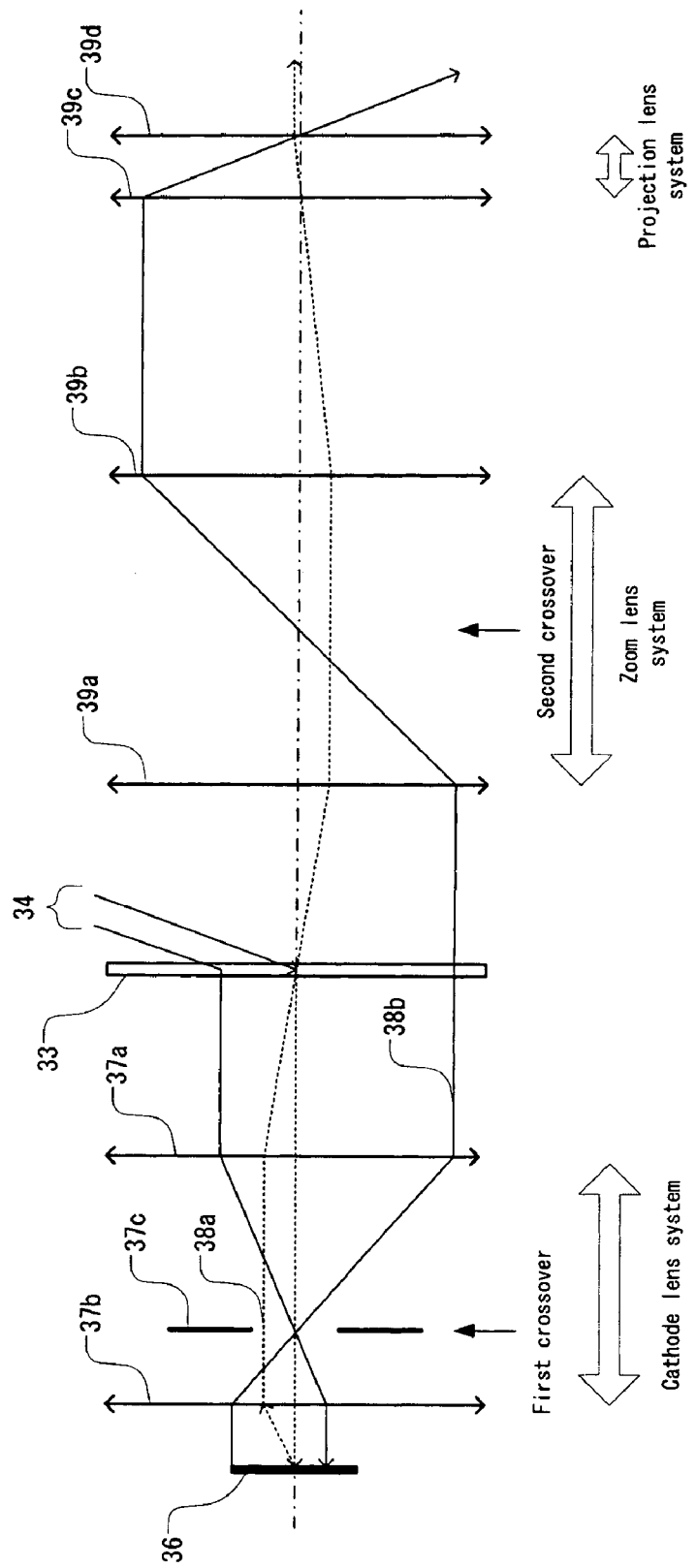
FIG. 6 shows the optical path of the electron beam in the essential parts of the projection imaging type electron microscope shown in FIG. 5.

An embodiment of the present invention will be described below with reference to the figures. However, the overall construction of the projection imaging type electron microscope in this case is the same as that of the conventional electron microscope shown in FIG. 5, and the illumination electron optical system up to the point of the electromagnetic prism is the same as that in a conventional microscope; accordingly, in the following description, only the projection image focusing electron optical system including the objective electron optical system will be described.

Figure 1:
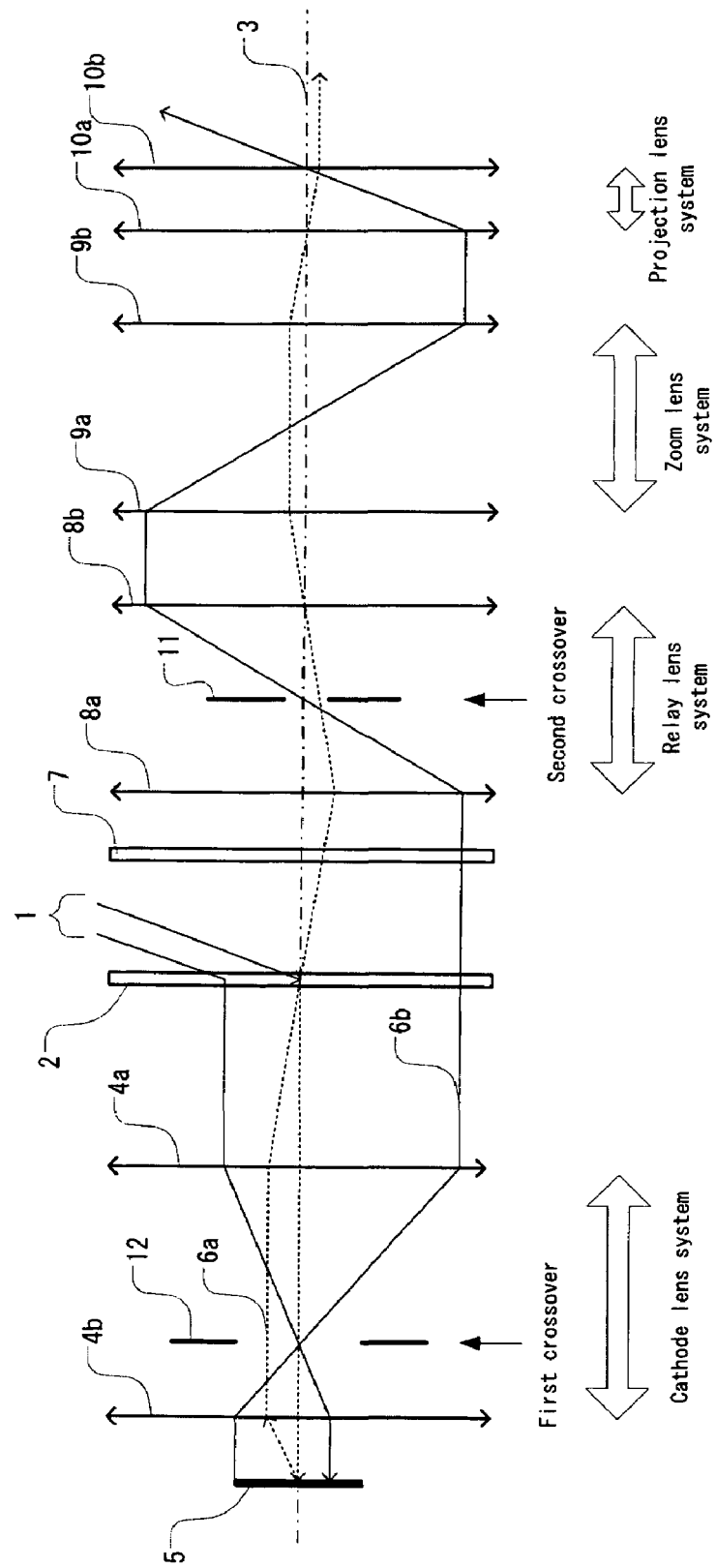
FIG. 1 shows an outline of the projection image focusing electron optical system in an projection imaging type electron microscope constituting an embodiment of the present invention.

FIG. 1 is a diagram showing an outline of the projection image focusing electron optical system in an projection imaging type electron microscope constituting an embodiment of the present invention. This figure shows a state in which the zoom system is set at a magnification that results in 1× image focusing. The orientation of the illuminating beam 1 from the illumination electron optical system is bent along the optical axis 3 of the projection image focusing optical system by the action of an electromagnetic prism 2. The illuminating beam 1 is caused to converge by the action of a cathode lens 4a, and then diverges and is caused to illuminate the sample 5 in a perpendicular (telecentric) manner by the action of a cathode lens 4b. The system is devised so that the position where the illuminating beam 1 converges is the first crossover position in the projection image focusing optical system.

The generated electrons 6a that are generated from a point on the optical axis of the sample 5 are caused to be parallel to the optical axis 3 by the cathode lens 4b, and are focused at the position of the electromagnetic prism 2 by the cathode lens 4a. Then, these electrons pass through the stigmator 7, are relayed by the relay lenses 8a and 8b, and are incident on the zoom lens 9a. In this case, the system is devised so that the generated electrons 6a cross the optical axis at the position of the relay lens 8b. The generated electrons 6a are parallel to the optical axis 3 between the zoom lenses 9a and 9b. The generated electrons 6a that have left the zoom lens 9b perform a third image focusing at the projection lens 10a, and are further projected onto the MCP by the projection lens 10b.

Meanwhile, the generated electrons 6b that are emitted from the sample 5 parallel to the optical axis (principal rays) are focused by a cathode lens and cross the optical axis 3 at one point. This point is the first crossover. The generated electrons 6b are caused to be parallel to the optical axis by the cathode lens 4a, and are focused as an image at the position of the electromagnetic prism 2; these electrons 6b pass through the stigmator 7 and are incident on the relay lens 8a. These electrons are then again focused so that the electrons cross the optical axis 3 at one point. This position is the second crossover. An aperture diaphragm 11 is disposed in this second crossover position.

Subsequently, the generated electrons 6b are oriented parallel to the optical axis by the relay lens 8b. These electrons pass through the zoom lenses 9a and 9b, and are again oriented parallel to the optical axis; then, these electrons are caused to cross the optical axis 3 at the position of the projection lens 10b by the projection lens 10a, and are subsequently incident on the MCP.

Furthermore, in the state shown in the figure, the generated electrons 6b that have left the zoom optical system are parallel to the optical axis, and are incident on the projection lens system in a perpendicular (telecentric) orientation. However, if the zoom magnification is varied, this relationship is altered, so that such a relationship is not maintained. This point will be described later.

An auxiliary diaphragm 12 is disposed in the first crossover position. This auxiliary diaphragm prevents generated electrons that make absolutely no contribution to image focusing from being incident on the subsequent optical system and contaminating the optical elements such as lenses, and prevents any increase in the Coulomb effect; accordingly, this diaphragm has an opening which is large enough so that there is no blocking of generated electrons that contribute to image focusing, and no blocking of the effective illuminating beam 1.

As was described above, the deviation of the second crossover position caused by the electromagnetic prism 2 is corrected by the stigmator 7, and an aperture diaphragm 11 is disposed in the second crossover position. In a conventional projection imaging type electron microscope, an aperture diaphragm is disposed in the first crossover position; accordingly, there is no need to correct the positional deviation of the second crossover position. However, in the present invention, in which an aperture diaphragm is installed at the second crossover, it is necessary to provide such correction.

Figure 2:
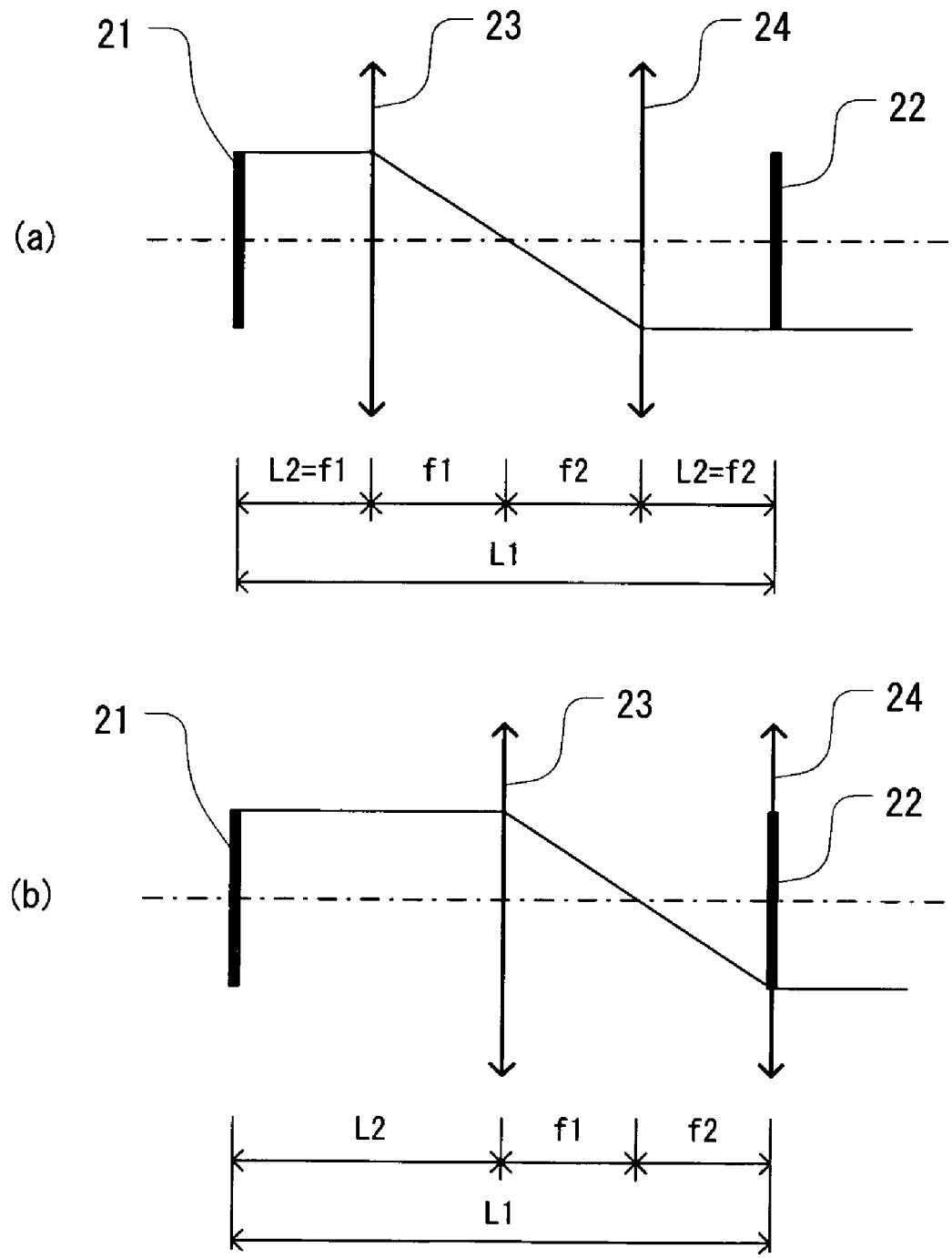
FIG. 2 is used to illustrate the action of the relay optical system used in an embodiment of the present invention.

In the optical system shown in FIG. 1, a second crossover is formed by the relay lens 8a, and an image plane (plane conjugate with the sample 5) is disposed in the position of the relay lens 8b. The technical significance of this will be described with reference to FIG. 2. FIG. 2 shows diagrams that compare a conventionally used relay optical system with the relay optical system used in FIG. 1.

In FIG. 2, (a) is a diagram showing a conventional relay optical system; this system relays the image of an intermediate image plane 21 to another intermediate image plane 22. For this purpose, the image of the intermediate image plane 21 is inverted and focused at a magnification of M on the intermediate image plane 22 by using the relay lenses 23 and 24. The distance L2 between the intermediate image plane 21 and the relay lens 23 is equal to the focal length f1 of the relay lens 23. The distance L1 between the intermediate image plane 21 and the intermediate image plane 22 is 2f1(1+M).

On the other hand, (b) in FIG. 2 is a diagram which shows the relay optical system used in FIG. 1. This is an optical system that relays an image of the intermediate image plane 21 to another intermediate image plane 22; this system is the same as the conventional relay optical system shown in (a) in that an image of the intermediate image plane 21 is inverted and focused at a magnification of M on the intermediate image plane 22, but differs in that image focusing is performed only by the relay lens 23, and in that the relay lens 24 is disposed in the same position as the intermediate image plane 22.

Accordingly, as is shown in the figures, L1=L2(1+M). In a case where the distance L1 between the intermediate image plane 21 and intermediate image plane 22 and the image focusing magnification M are set at the same values, the length of L2 in (b) can be set at twice the length of L2 in (a), so that a space for the installation of the stigmator can be formed between these image planes. Accordingly, even if a stigmator is installed, the apparatus can be constructed without increasing the length of the relay optical system.

Figure 3:
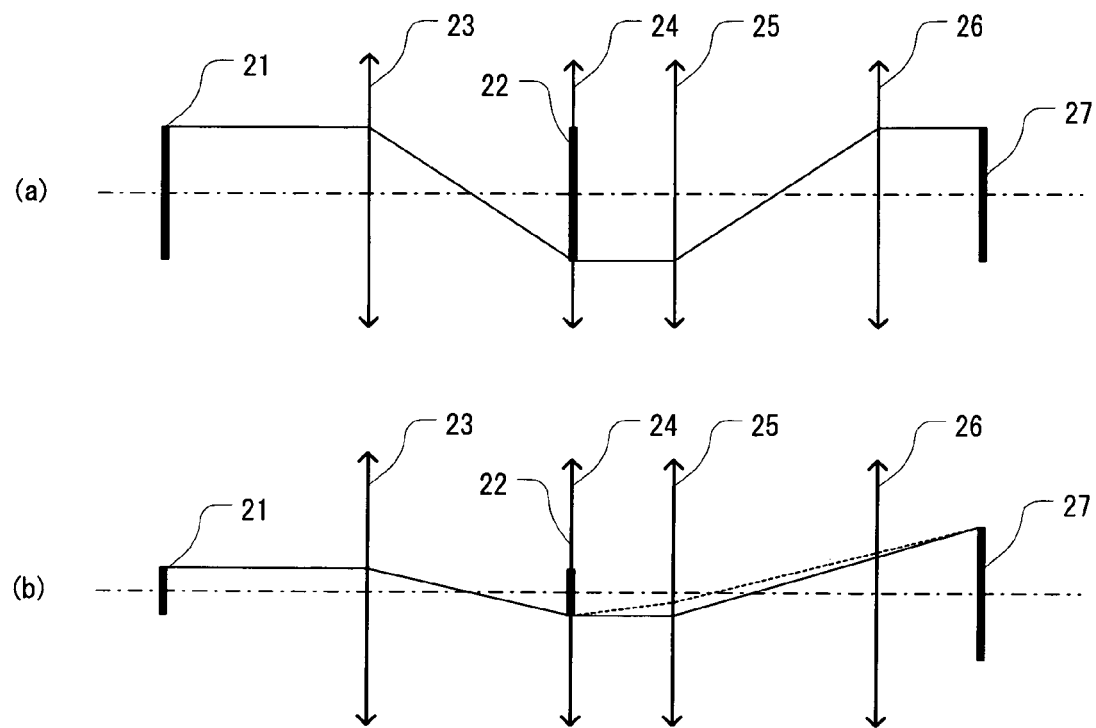
FIG. 3 illustrates the method used to alleviate collapse of the telecentric properties at the image focusing plane as a result of variation of the image magnification in the zoom optical system.

By devising the relay optical system as shown in (b), it is also possible to alleviate the collapse of telecentric properties at the image focusing plane caused by the variation of the image magnification in the zoom optical system. This will be described with reference to FIG. 3.

FIG. 3(a) is a diagram showing the optical path in a case where the image magnification is 1×. The principal rays passing through the relay optical system shown in FIG. 2(b) advances in parallel, and an image of the intermediate image plane 22 is inverted and focused on the intermediate image plane 27 by the action of the zoom lens 25 and zoom lens 26. In this case, the telecentric properties of the intermediate image plane 27 are maintained.

FIG. 3(b) is a diagram showing the optical path in a case where the image magnification is set at 3×. In this case, the power of the zoom lens 26 is zero. In this state, if the power of the relay lens 24 is set at the same value as in FIG. 3(a), the principal rays emitted via the relay lens 24 remain parallel to the optical axis, and the principal rays reach the intermediate image plane 27 via the optical path indicated by a solid line. As is shown in the figure, the telecentric properties at the intermediate image plane 27 collapse.

In this state, if the power of the relay lens is strengthened, the principal rays advance along the optical path indicated by a broken line in the figure, so that telecentric properties at 27 are improved. As a result, distortion and transverse aberration at points not on the optical axis can be ameliorated.

Figure 4:
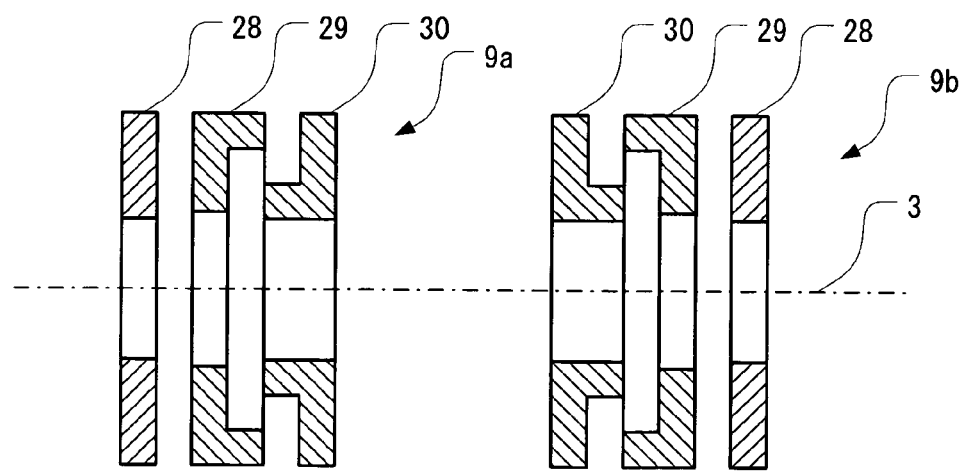
FIG. 4 shows the electrode construction of the zoom lenses 9a and 9b in FIG. 1.

FIG. 4 is a diagram showing the electrode construction of the zoom lenses 9a and 9b in FIG. 1; this figure is a sectional view cut along a plane that includes the optical axis 3. The respective zoom lenses 9a and 9b are formed by a combination of a GND electrode 28, an application electrode 29 and a GND electrode 30; each of these electrodes has a circular shape in a section cut along a plane perpendicular to the optical axis 3.

The zoom lens 9a and zoom lens 9b are the same; however, the disposition of the electrodes of these lenses is in a mirror-image relationship with respect to a plane oriented at right angles to the optical axis 3. The construction of a zoom system in which the same electrodes are thus disposed in a mirror-image relationship offers the following merits.

In cases where low-magnification image focusing is performed, a large visual field size is used; generally, therefore, distortion and transverse chromatic aberration are increased. The present embodiment assumes that a zoom of 1× to 3× will be performed; however, in the case of low-magnification image focusing, i.e., in the case of a magnification of 1×, the electron tracks are almost completely symmetrical with respect to the third crossover position as shown in FIG. 3(a), so that the optical system is close to an optical system that is telecentric on the entry and exit sides. In this case, the distortion and transverse chromatic aberration of the two zoom lenses 9a(25) and 9b(26) cancel each other, so that the aberration in the case of low-magnification image focusing is reduced.

Furthermore, it is desirable that the length of the zoom system be as short as possible. However, if an attempt is made to shorten this length, then it is necessary to shorten the focal length of the zoom lenses 9a and 9b; as a result, it is necessary to reduce the internal diameters of the respective electrodes or to increase the voltage that is applied to the anode 29. If the applied voltage is increased, the cost of the power supply device is correspondingly increased; in actuality, therefore, it is more preferable to deal with this problem by reducing the internal diameters of the respective electrodes. In this case, since the region near the axis is narrowed, the aberration is aggravated. However, if the electrodes are disposed as shown in FIG. 4, the aberrations of the two zoom lenses 9a(25) and 9b(26) cancel each other, so that the aggravation of the aberration is alleviated.

Moreover, by making the two zoom lenses 9a and 9b the same, it is possible to facilitate assembly and the procurement of parts, so that the cost is reduced.

What is claimed is:

1. A projection imaging electron microscope, comprising:
    an electron beam source for illuminating a sample surface of a sample with an electron beam to generate a signal electron beam from the sample; and
    a projection image focusing optical system for forming an image of the sample surface on a detection surface of a detector, the projection image focusing optical system comprising an electromagnetic prism to direct the signal electron beam, a zoom lens, and a relay optical system provided between the zoom lens and the electromagnetic prism;
    wherein an aperture diaphragm, which determines an opening angle of the projection image focusing optical system, is disposed inside of the relay optical system and at a position of a second crossover of the signal electron beam in the projection image focusing optical system as counted from the sample surface.

2. The projection imaging electron microscope according to claim 1, wherein a diaphragm with a size that does not block an effective range of the illuminating electron beam and that does not block the signal electron beam passing through the aperture diaphragm of the projection image focusing optical system, is disposed at a first crossover position of the signal electron beam in the projection image focusing optical system as counted from the sample surface.

3. The projection imaging electron microscope according to claim 1, wherein a stigmator that corrects astigmatic aberration of the electromagnetic prism is disposed between the electromagnetic prism and the aperture diaphragm.

4. The projection imaging electron microscope according to claim 1, wherein the relay optical system includes a first lens which images a first intermediate image of the sample surface as a second intermediate image, and a second lens which is disposed at a position of the second intermediate image.

5. The projection imaging electron microscope according to claim 1, wherein the zoom lens consists of two lenses which are constructed to be geometrically symmetric with respect to a geometric mid-plane of the zoom lens that is perpendicular to an optical axis through the zoom lens.

6. A projection imaging electron microscope in which a sample surface is observed, comprising:
an electron beam source that emits an illuminating electron beam;
an electromagnetic prism;
an illumination electron optical system that causes the illuminating electron beam to be incident on the electromagnetic prism;
an objective electron optical system that illuminates the sample surface with the illuminating electron beam that passes through the electromagnetic prism;
a detector; and
an image-forming electron optical system which conducts a signal electron beam of electrons that pass from the sample surface through the electromagnetic prism to the detector, and which images a first intermediate image of the sample surface on a detection surface of the detector, the image-forming electron optical system comprising a zoom lens, and a relay optical system provided between the zoom lens and the electromagnetic prism;
wherein the sample surface is illuminated with the illuminating electron beam by Koehler illumination, and the objective electron optical system is an object-side telecentric optical system; and
wherein in a projection image focusing optical system, which includes the objective electron optical system, the electromagnetic prism and the image-forming optical system, and which forms an image of the sample surface on the detection surface of the detector, an aperture diaphragm, which determines an opening angle of the projection image focusing optical system, is disposed inside the relay optical system and at a position of a second crossover of the signal electron beam in the projection image focusing optical system as counted from the sample surface.

7. The projection imaging electron microscope according to claim 6, wherein a diaphragm with a size that does not block an effective range of the illuminating electron beam and that does not block the signal electron beam passing through the aperture diaphragm of the projection image focusing optical system, is disposed at a first crossover position of the signal electron beam in the projection image focusing optical system as counted from the sample surface.

8. The projection imaging electron microscope according to claim 6, wherein a stigmator that corrects astigmatic aberration of the electromagnetic prism is disposed between the electromagnetic prism and the aperture diaphragm.

9. The projection imaging electron microscope according to claim 6, wherein the relay optical system includes a first lens which images the first intermediate image of the sample surface as a second intermediate image, and a second lens which is disposed at a position of the second intermediate image.

10. The projection imaging electron microscope according to claim 6, wherein the zoom lens consists of two lenses which are constructed to be geometrically symmetric with respect to a geometric mid-plane of the zoom lens that is perpendicular to an optical axis through the zoom lens.

* * * * *